United States Patent
Chang

(10) Patent No.: US 7,598,894 B2
(45) Date of Patent: Oct. 6, 2009

(54) SOURCE DRIVER AND DIGITAL-TO-ANALOG CONVERTER THEREOF

(75) Inventor: Yu-Jui Chang, Tainan County (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 11/875,283

(22) Filed: Oct. 19, 2007

(65) Prior Publication Data

US 2009/0102691 A1    Apr. 23, 2009

(51) Int. Cl.
H03M 1/66    (2006.01)
(52) U.S. Cl. .......................... 341/144; 345/89; 348/254
(58) Field of Classification Search ......... 341/130–144; 345/690, 595, 589, 694, 89; 348/254, 518, 348/674, 790
See application file for complete search history.

(56) References Cited

U.S. PATENT DOCUMENTS

| | | | | |
|---|---|---|---|---|
| 5,808,571 A | * | 9/1998 | Kuwata et al. .............. | 341/100 |
| 6,181,314 B1 | * | 1/2001 | Nakajima et al. ........... | 345/100 |
| 6,310,593 B1 | * | 10/2001 | Nakao ......................... | 345/87 |
| 6,424,281 B1 | * | 7/2002 | Liaw et al. .................. | 341/144 |
| 6,437,720 B1 | * | 8/2002 | Yin et al. ..................... | 341/144 |
| 6,590,516 B2 | * | 7/2003 | Inagaki et al. ............... | 341/144 |
| 6,747,626 B2 | * | 6/2004 | Chiang ......................... | 345/98 |
| 7,253,664 B2 | * | 8/2007 | Yeh .............................. | 341/120 |
| 7,268,711 B1 | * | 9/2007 | Hofer .......................... | 341/144 |

* cited by examiner

Primary Examiner—Lam T Mai
(74) Attorney, Agent, or Firm—J.C. Patents

(57) ABSTRACT

A source driver and a digital-to-analog converter (DAC) thereof are provided. The DAC converts an input data into an analog voltage. The DAC includes a reference voltage generation unit, a switch unit, and a selection unit. The reference voltage generation unit provides a plurality of voltage levels. The switch unit is coupled to the reference voltage generation unit and determines whether to output the voltage levels, wherein the switch unit is turned off during a data conversion period of the input data. The selection unit is coupled to the reference voltage generation unit via the switch unit, and the selection unit selects one of the voltage levels output by the switch unit according to the input data, wherein the selected voltage level is served as the analog voltage output by the DAC.

14 Claims, 7 Drawing Sheets

SOURCE DRIVER AND DIGITAL-TO-ANALOG CONVERTER THEREOF

BACKGROUND OF THE INVENTION

1. Field of the Invention

The present invention generally relates to a digital-to-analog converter (DAC), in particular, to a source driver and a DAC thereof which produce no gamma coupling.

2. Description of Related Art

FIG. 1 is a diagram of a conventional source driver. Referring to FIG. 1, the conventional source driver 110 includes a shift register 111, a data latch 112, a line latch 113, and a digital-to-analog converter 114. The shift register 111 generates a plurality of shift signals having different delay times according to a start pulse EIO output by a timing controller 120. Next, the data latch 112 latches a digital data DATA output by the timing controller 120 according to the shift signals and transmits the result to the line latch 113. After that, the line latch 113 latches the output of the data latch 112, namely, the line latch 113 updates the output of its own according to a line latch signal STB output by the timing controller 120. Finally, the DAC 114 converts the output of the line latch 113 into an analog voltage according to a gamma voltage Vgamma output by a gamma voltage generator 130, so that a display panel 140 can display an image according to the analog voltage.

The circuit of the DAC 114 may adopt a ROM-type structure or a binary structure. FIG. 2 is a diagram of a conventional ROM-type DAC. Referring to FIG. 2, a gamma voltage generator 210, a line latch 220, and a DAC 230 are illustrated, and VDD and GND respectively represent a supply voltage and a common voltage. The DAC 230 includes a reference voltage generation unit 240 and a selection unit 250, wherein the selection unit 250 further includes a decoding unit 251 and a plurality of selection switches 252. In the present embodiment, the selection switches 252 are all implemented with metal oxide semiconductor (MOS) transistors. The DAC 230 is referred as a ROM-type DAC because that the couplings between the selection switches 252 preset the selection unit 250 as a ROM-type selection unit.

The decoding unit 251 decodes an input data DIN output by the line latch 220 so as to obtain the control signals DP0, DP0B, DP1, DP1B, DP2, and DP2B for controlling the on/off the selection switches 252, wherein the control signals DP0B, DP1B, and DP2B are respectively the reverse signals of the control signals DP0, DP1, and DP2, and each of the selection switches 252 receives the control signals as illustrated in FIG. 2. The on/off of all the selection switches are determined by the control signals. Eventually, the selection unit 250 selects one of a plurality of voltage levels output by the reference voltage generation unit 240 according to the input data DIN, and the selected voltage level is served as an analog voltage AOUT which is output correspondingly by the DAC 230.

However, during a data conversion period of the input data DIN, a transient gamma coupling (also referred as gamma short) may be produced in such a DAC structure.

FIG. 3 is a diagram of a conventional binary DAC. Referring to FIG. 3, a gamma voltage generator 210, a line latch 220, and a DAC 430 are illustrated, and VDD and GND respectively represent a supply voltage and a common voltage. The DAC 430 includes a reference voltage generation unit 240 and a selection unit 450, wherein the selection unit 450 further includes a decoding unit 251 and a plurality of selection switches 452. The DAC 430 is referred as a binary DAC because that the couplings between the selection switches 452 preset the selection unit 450 as a binary selection unit.

Referring to both FIG. 2 and FIG. 3, it can be understood by comparing the two selection units that as to a resistor at the same position in the reference voltage generation unit, the selection switches coupled to the resistor in the binary DAC is less than the selection switches coupled to the resistor in the ROM-type DAC. Thereby, the possibility of gamma coupling produced by the binary DAC is greater than the possibility of gamma coupling produced by the ROM-type DAC. In other words, the binary DAC produces more gamma couplings than the ROM-type DAC.

SUMMARY OF THE INVENTION

Accordingly, the present invention is directed to a digital-to-analog converter (DAC) which produces no gamma coupling.

The present invention is directed to a source driver having an aforementioned DAC, wherein the source driver produces no gamma coupling and accordingly drives a display panel to output stable images.

The present invention provides a DAC including a reference voltage generation unit, a switch unit, and a selection unit. The DAC converts an input data into an analog voltage. The reference voltage generation unit provides a plurality of voltage levels. The switch unit is coupled to the reference voltage generation unit and determines whether to output the voltage levels, wherein the switch unit is turned off during a data conversion period of the input data. The selection unit is coupled to the reference voltage generation unit via the switch unit, and the selection unit selects one of the voltage levels output by the switch unit according to the input data, wherein the selected voltage level is served as the analog voltage output by the DAC.

The present invention provides a source driver including a line latch and a DAC. The line latch updates an input data according to a line latch signal, and the DAC converts the input data into an analog voltage. The DAC further includes a reference voltage generation unit, a switch unit, and a selection unit. The reference voltage generation unit provides a plurality of voltage levels. The switch unit is coupled to the reference voltage generation unit and determines whether to output the voltage levels according to the line latch signal, wherein the switch unit is turned off during a data conversion period of the input data. The selection unit is coupled to the reference voltage generation unit via the switch unit, and the selection unit selects one of the voltage levels output by the switch unit according to the input data, wherein the selected voltage level is served as the analog voltage output by the DAC.

According to an embodiment of the present invention, the switch unit includes a plurality of switches, wherein each switch determines whether to conduct one of the voltage levels provided by the reference voltage generation unit to the selection unit.

According to an embodiment of the present invention, the DAC further includes a control unit, wherein the control unit increases the pulse width of the line latch signal so as to control the switch unit.

In a DAC provided by the present invention, a switch unit including a plurality of switches is disposed between a reference voltage generation unit and a selection unit, wherein each switch determines whether to conduct one of a plurality of voltage levels provided by the reference voltage generation unit to the selection unit, and all the switches in the switch unit are turned off during a data conversion period of an input data. Thereby, the DAC in the present invention produces no gamma coupling. Moreover, a source driver provided by the present invention includes an aforementioned DAC, thus, the source driver produces no gamma coupling and accordingly can drive a display panel to display stable images.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
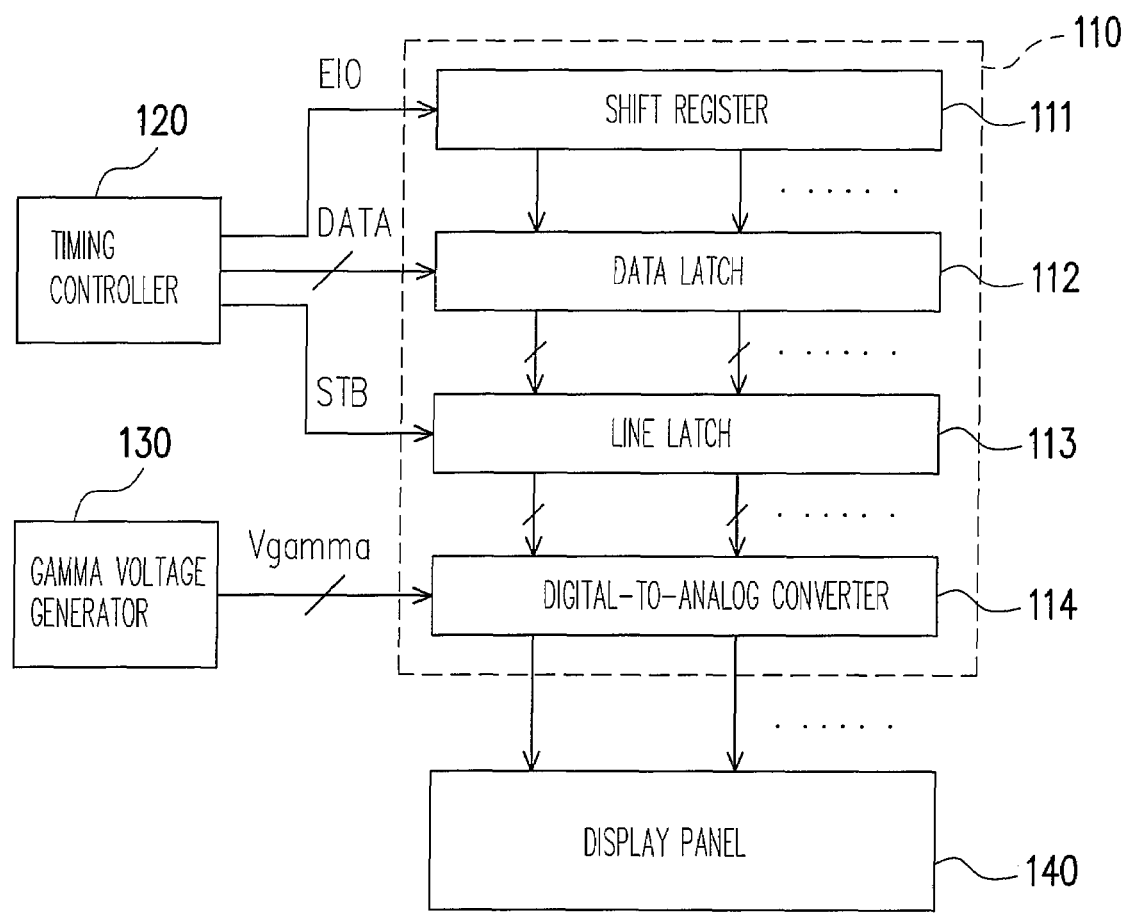
FIG. 1 is a diagram of a conventional source driver.

Reference will now be made in detail to the present preferred embodiments of the invention, examples of which are illustrated in the accompanying drawings. Wherever possible, the same reference numbers are used in the drawings and the description to refer to the same or like parts.

Figure 4:
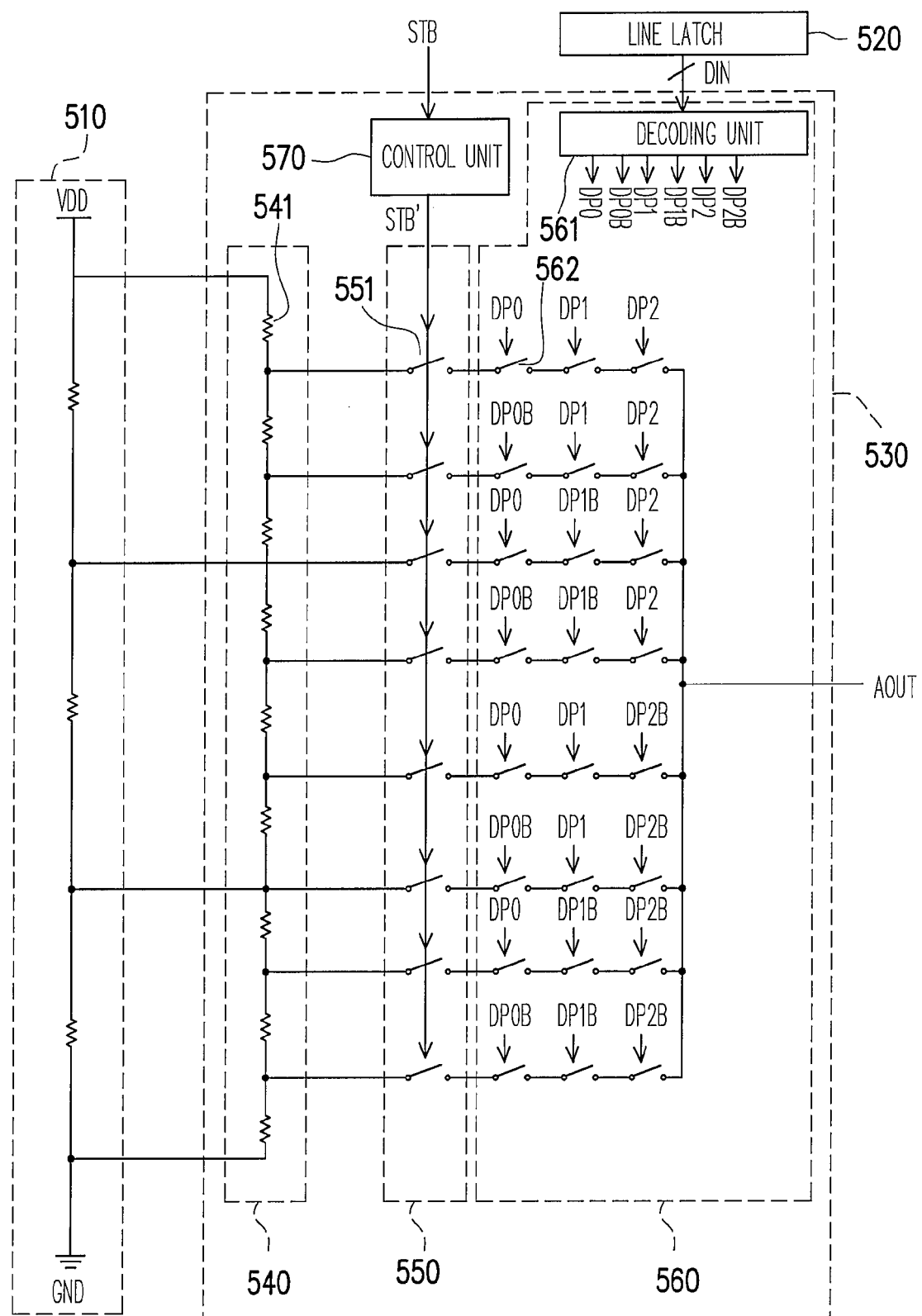
FIG. 4 is a diagram of a DAC according to an embodiment of the present invention.

FIG. 4 is a diagram of a digital-to-analog converter (DAC) according to an embodiment of the present invention. Referring to FIG. 4, a gamma voltage generator 510, a line latch 520, and a DAC 530 are illustrated, and VDD and GND respectively represent a supply voltage and a common voltage. The DAC 530 converts an input data DIN output by the line latch 520 into an analog voltage AOUT, and the DAC 530 includes a reference voltage generation unit 540, a switch unit 550, a selection unit 560, and a control unit 570. The reference voltage generation unit 540 is coupled to the gamma voltage generator 510 and provides a plurality of voltage levels. The control unit 570 increases the pulse width of a line latch signal STB to generate a signal STB'. The switch unit 550 is coupled to the reference voltage generation unit 540 and the control unit 570, and the switch unit 550 determines whether to output the voltage levels according to the signal STB' output by the control unit 570. The selection unit 560 is coupled to the reference voltage generation unit 540 via the switch unit 550, and the selection unit 560 selects one of the voltage levels output by the switch unit 550 according to the input data DIN, wherein the selected voltage level is served as the analog voltage AOUT output by the DAC 530.

As shown in FIG. 4, the reference voltage generation unit 540 includes a plurality of resistors 541 connected to each other in series, and the resistors divide the supply voltage VDD and the common voltage GND into the voltage levels. The switch unit 550 includes a plurality of switches 551, wherein each switch determines whether to conduct one of the voltage levels provided by the reference voltage generation unit 540 to the selection unit 560. The selection unit 560 includes a decoding unit 561 and a plurality of selection switches 562. The decoding unit 561 decodes the input data DIN output by the line latch 520 to obtain control signals DP0, DP0B, DP1, DP1B, DP2, and DP2B for controlling the on/off of the selection switches 562, and accordingly, the decoding unit 561 controls the selection switches 562 according to the input data DIN to select one of the voltage levels as the analog voltage AOUT output by the DAC 530, wherein the control signals DP0B, DP1B, and DP2B are respectively reverse signals of the control signals DP0, DP1, and DP2, and each selection switch 562 receives the control signals as illustrated in FIG. 4. It can be understood from the couplings between the selection switches 562 that the selection unit 560 is a ROM-type selection unit. In the present embodiment, the selection switches 562 are all implemented with MOS transistors.

Figure 2:
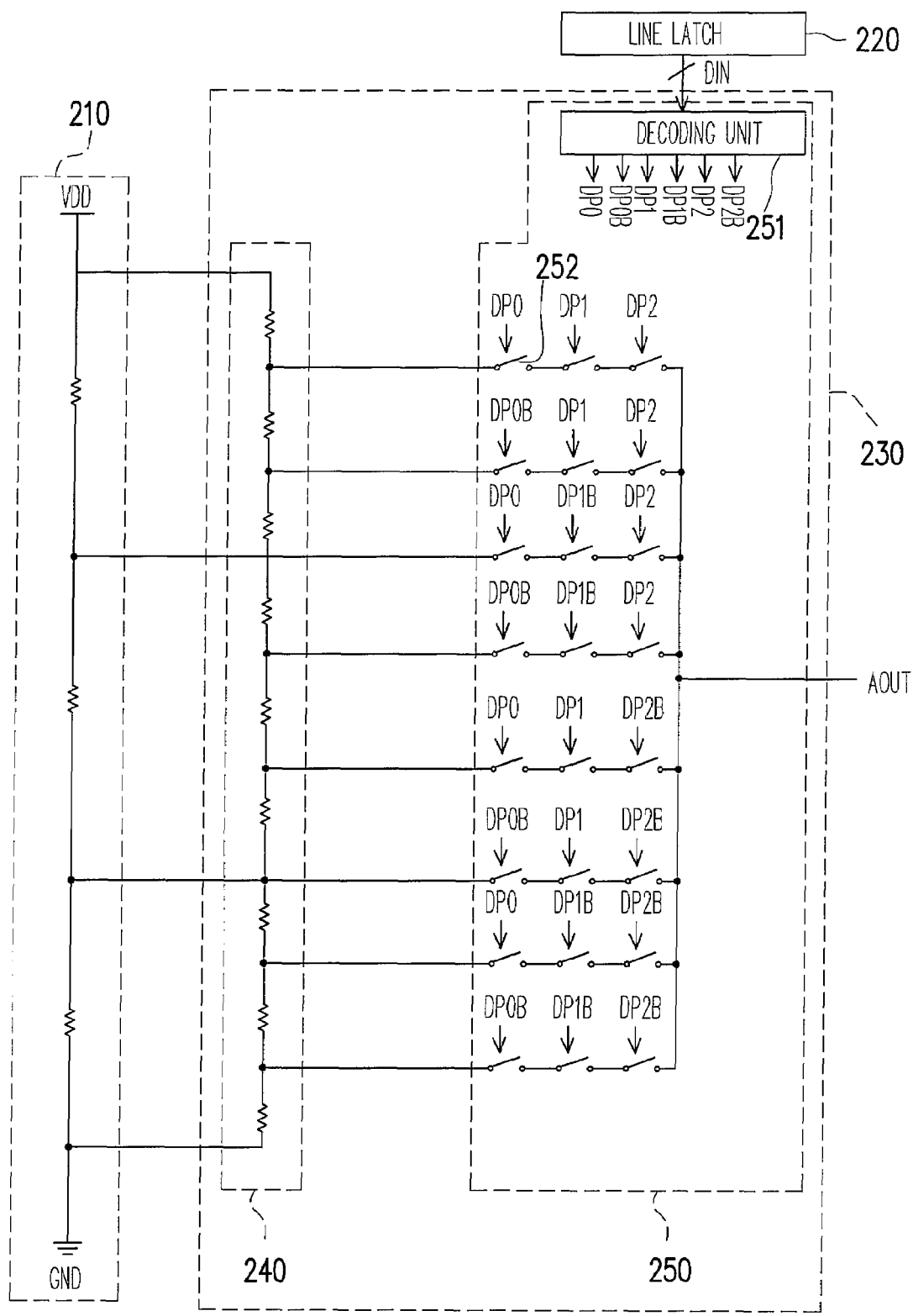
FIG. 2 is a diagram of a conventional digital-to-analog converter (DAC) having a read-only memory (ROM) type structure.
Figure 3:
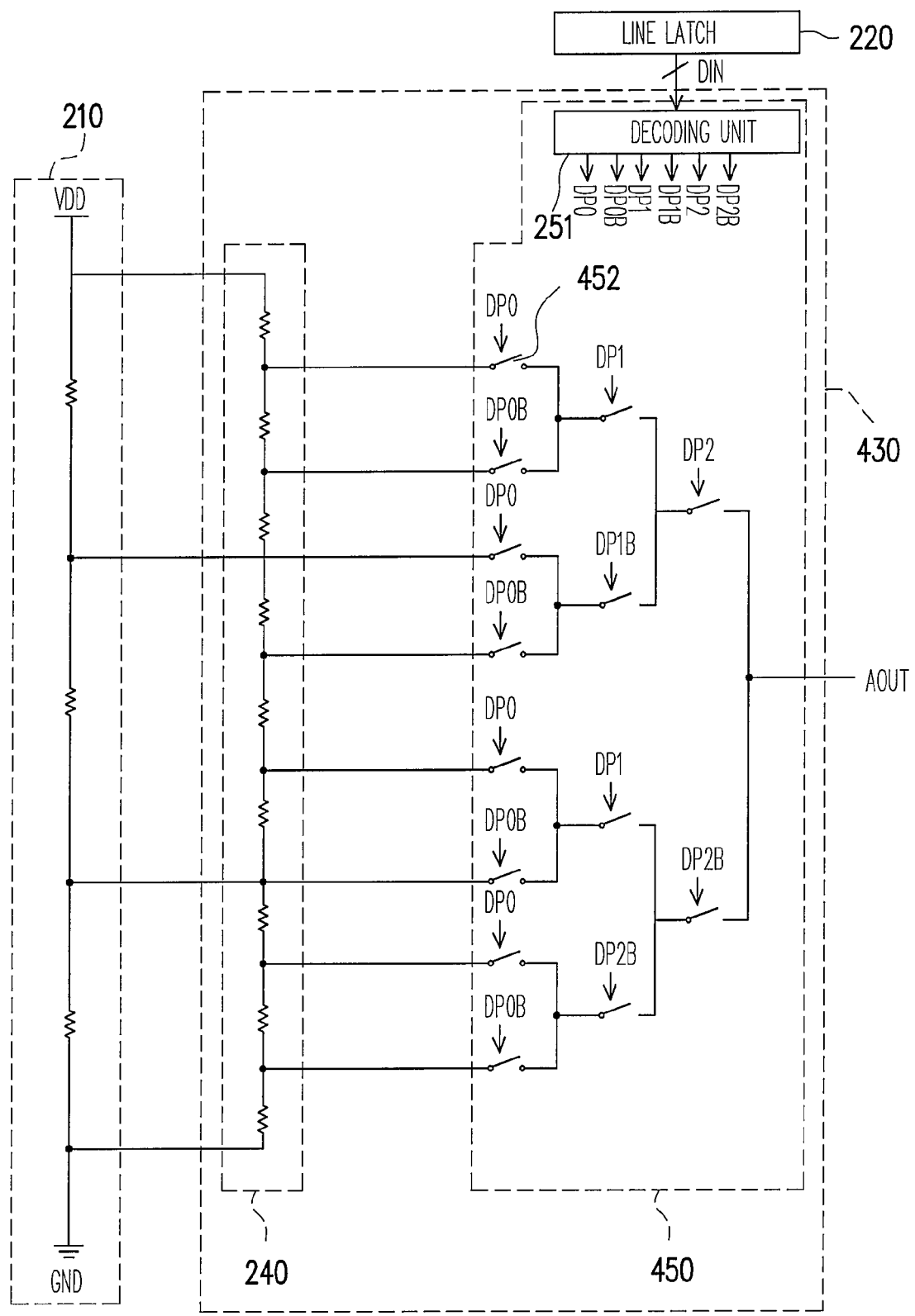
FIG. 3 is a diagram of a conventional binary DAC.
Figure 5:
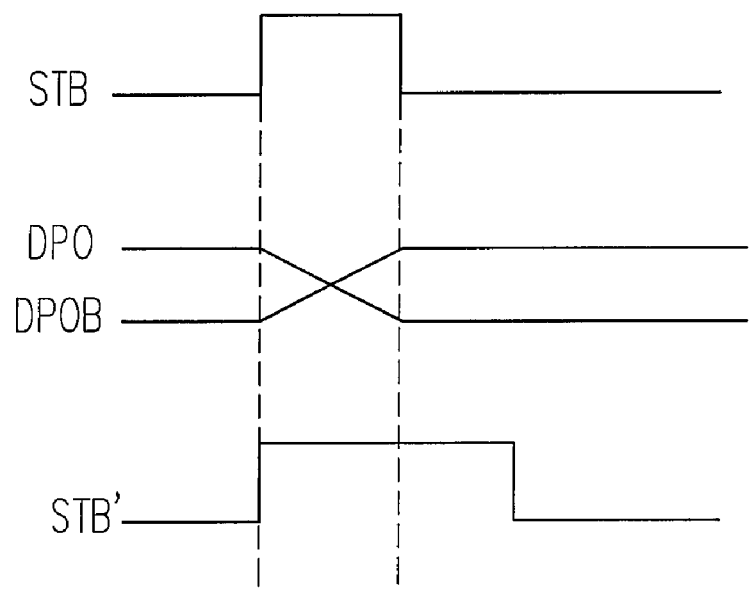
FIG. 5 is a waveform of signals STB, STB', DP0, and DP0B.

Referring to both FIG. 2 and FIG. 4, the difference of the DAC 530 in the present embodiment from the conventional DAC 230 is that the DAC 530 further includes the switch unit 550 and the control unit 570. The operations of the switch unit 550 and the control unit 570 can be explained with reference to FIG. 5. FIG. 5 is a waveform of signals STB, STB', DP0, and DP0B. Referring to FIG. 5, the line latch 520 outputs the input data DIN according to the line latch signal STB. Thus, the pulse enable duration of the line latch signal STB is for the data conversion of the input data DIN, and the control signals output by the decoding unit 561 transit during this period as illustrated in FIG. 5 (control signals DP0 and DP0B).

The switches 551 are turned off during the assertion of the signal STB', and therefore, the gamma coupling can be prevented as long as the selection unit 560 does not receive the voltage levels output by the reference voltage generation unit 540 during the data conversion period of the input data DIN.

Figure 6:
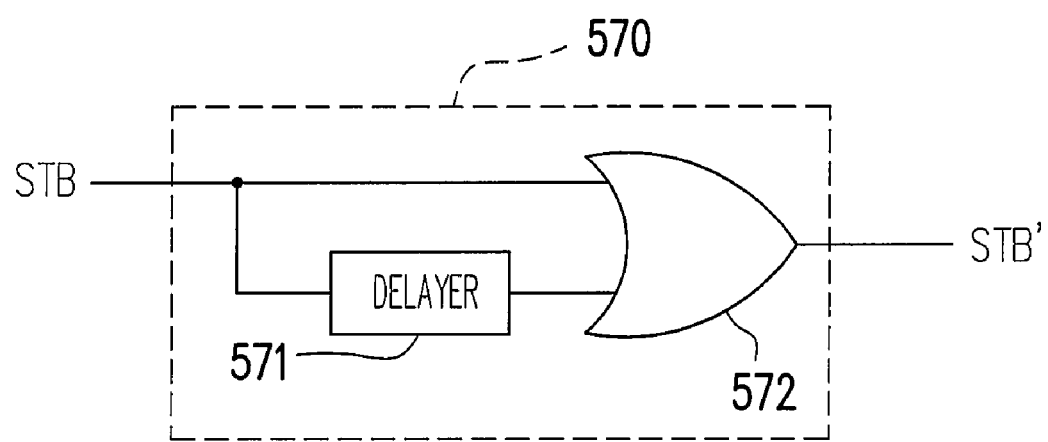
FIG. 6 is a circuit diagram of a control unit 570.

In the present embodiment, the control unit 570 can be implemented as illustrated in FIG. 6. FIG. 6 is a circuit diagram of the control unit 570. Referring to FIG. 6, the control unit 570 includes a delayer 571 and an OR gate 572. The delayer 571 receives and delays the line latch signal STB. An input terminal of the OR gate 572 receives the line latch signal STB, and another input terminal thereof is coupled to the output of the delayer 571. Accordingly, the OR gate 572 can output the signal STB' to control the switch unit 550. The delay time of the delayer 571 can be determined according to the actual requirement. Besides, in the present embodiment, even though the on/off of the switches in the switch unit 550 is controlled by the control unit 570, the internal structure of the DAC 530 in the present embodiment is not limited thereto. It can be understood from the operation manner of the switch unit 550 described above, gamma coupling can be prevented as long as the switch unit 550 is turned off during the data conversion period of the input data DIN. Accordingly, the switch unit 550 can be turned off in different ways.

Figure 7:
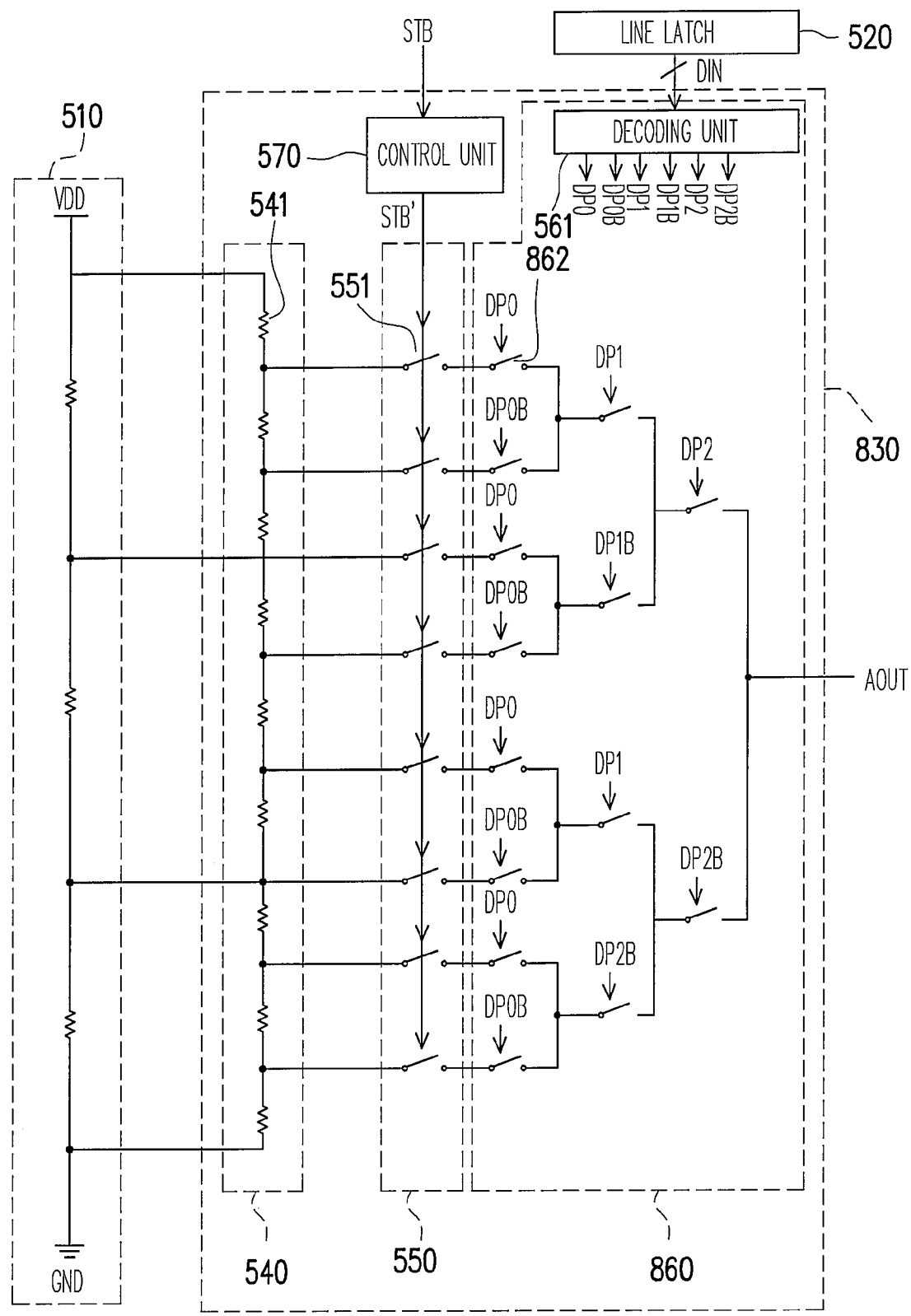
FIG. 7 is a diagram of a DAC according to an embodiment of the present invention.

Similarly, gamma coupling can also be prevented in a binary DAC by using foregoing control unit and line latch signal STB, as shown in FIG. 7.

FIG. 7 is a diagram of a DAC according to an embodiment of the present invention. Referring to FIG. 7, a gamma voltage generator 510, a line latch 520, and a DAC 830 are illustrated, and VDD and GND respectively represent a supply voltage and a common voltage. The DAC 830 includes a reference voltage generation unit 540, a switch unit 550, a selection unit 860, and a control unit 570, and the selection unit 860 further includes a decoding unit 561 and a plurality of selection switches 862. In the present embodiment, the selection switches 862 are also implemented with MOS transistors. It can be understood from the couplings between the selection switches 862 that the selection unit 860 is a binary selection unit. The operations of the switch unit 550 and the control unit 570 in FIG. 7 are similar to those of the switch unit 550 and the control unit 570 in FIG. 4 therefore will not be described herein. However, whether to adopt the control unit 570 and the line latch signal STB can be determined according to the actual requirement.

Figure 8:
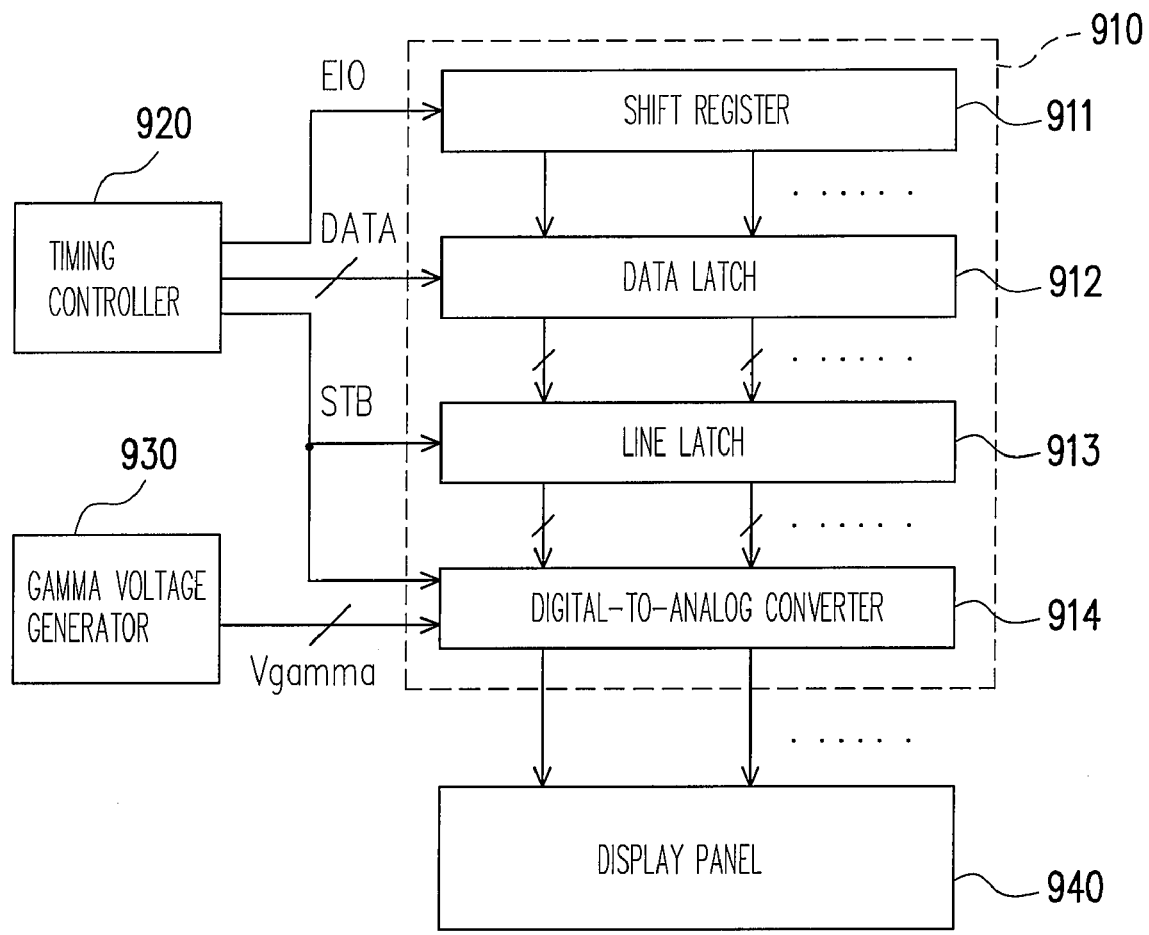
FIG. 8 is a diagram of a source driver according to an embodiment of the present invention.

Below, a source driver having an aforementioned DAC will be described with reference to another embodiment of the present invention. FIG. 8 is a diagram of a source driver according to an embodiment of the present invention. The source driver 910 includes a shift register 911, a data latch 912, a line latch 913, and a DAC 914. First, the shift register 911 generates a plurality of shift signals having different delay times according to a start pulse EIO output by a timing controller 920. Next, the data latch 912 latches a digital data DATA output by the timing controller 920 according to the shift signals and transmits the result to the line latch 913. After that, the line latch 913 latches the output of the data latch 912, namely, the line latch 913 updates the output of its own according to a line latch signal STB output by the timing controller 920. Finally, the DAC 914 converts the output of the line latch 913 into an analog voltage according to a gamma voltage Vgamma output by the gamma voltage generator 930 and prevents gamma coupling by using the line latch signal STB. Accordingly, a display panel 940 can display a stable image according to the analog voltage.

The shift register 911 and the data latch 912 convert a serial digital data DATA into a parallel data to be provided to the line latch 913. However, because the timing controller 920 can directly output parallel digital data DATA in a different design, in this case, the shift register 911 and the data latch 912 may not be adopted by the source driver 910. Besides, regardless of whether the selection unit in the DAC 914 is a ROM-type selection unit or a binary selection unit, gamma coupling can always be effectively prevented according to the operation results of the circuits illustrated in FIG. 4 and FIG. 7.

In overview, in the DAC described above, a switch unit is disposed between the reference voltage generation unit and the selection unit, and the switch unit includes a plurality of switches, wherein each switch determines whether to conduct one of the voltage levels provided by the reference voltage generation unit to the selection unit, and all the switches in the switch unit are turned off during a data conversion period of the input data. Thereby, the DAC described above produces no gamma coupling. Moreover, the source driver in the present embodiment adopts a foregoing DAC, thus, the source driver does not produce gamma coupling and accordingly can drive a display panel to display stable images.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter (DAC), for converting an input data into an analog voltage, the DAC comprising:
    a reference voltage generation unit, providing a plurality of voltage levels;
    a switch unit, coupled to the reference voltage generation unit, for determining whether to output the voltage levels, wherein the switch unit is turned off during a data conversion period of the input data; and
    a selection unit, coupled to the reference voltage generation unit via the switch unit, the selection unit selecting one of the voltage levels output by the switch unit according to the input data, wherein the selected voltage level is served as the analog voltage output by the DAC.

2. The DAC according to claim 1, wherein the switch unit comprises a plurality of switches, and each of the switches determines whether to conduct one of the voltage levels provided by the reference voltage generation unit to the selection unit.

3. The DAC according to claim 1, wherein the reference voltage generation unit comprises a plurality of resistors connected in series, and the resistors divide a first voltage and a second voltage into the voltage levels.

4. The DAC according to claim 1, wherein the selection unit comprises:
    a plurality of selection switches; and
    a decoding unit, controlling the selection switches according to the input data to select one of the voltage levels as the analog voltage output by the DAC.

5. The DAC according to claim 1, wherein the selection unit is a binary selection unit.

6. The DAC according to claim 1, wherein the selection unit is a read-only memory (ROM) type selection unit.

7. A source driver, comprising:
    a line latch, updating an input data according to a line latch signal; and
    a DAC, converting the input data into an analog voltage, the DAC comprising:
        a reference voltage generation unit, providing a plurality of voltage levels;
        a switch unit, coupled to the reference voltage generation unit, for determining whether to output the voltage levels according to the line latch signal, wherein the switch unit is turned off during a data conversion period of the input data; and
        a selection unit, coupled to the reference voltage generation unit via the switch unit, the selection unit selecting one of the voltage levels output by the switch unit according to the input data, wherein the selected voltage level is served as the analog voltage output by the DAC.

8. The source driver according to claim 7, wherein the switch unit comprises a plurality of switches, and each of the switches determines whether to conduct one of the voltage, levels provided by the reference voltage generation unit to the selection unit.

9. The source driver according to claim 7, wherein the reference voltage generation unit comprises a plurality of resistors connected in series, and the resistors divide a first voltage and a second voltage into the voltage levels.

10. The source driver according to claim 7, wherein the selection unit comprises:
    a plurality of selection switches; and
    a decoding unit, controlling the selection switches according to the input data to select one of the voltage levels as the analog voltage output by the DAC.

11. The source driver according to claim 7, wherein the selection unit is a binary selection unit.

12. The source driver according to claim 7, wherein the selection unit is a ROM-type selection unit.

13. The source driver according to claim 7, wherein the DAC further comprises:
    a control unit, increasing the pulse width of the line latch signal to control the switch unit.

14. The source driver according to claim 13, wherein the control unit comprises:
    a delayer, receiving and delaying the line latch signal; and
    an OR gate, having a first input terminal for receiving the line latch signal, a second input terminal coupled to an output of the delayer, and an output for controlling the switch unit.

* * * * *